(12) United States Patent
Ma et al.

(10) Patent No.: US 8,796,744 B1
(45) Date of Patent: Aug. 5, 2014

(54) SEMICONDUCTOR DEVICE

(71) Applicants: Xiaolong Ma, Beijing (CN); Huaxiang Yin, Beijing (CN); Sen Xu, Beijing (CN); Huilong Zhu, Poughkeepsie, NY (US)

(72) Inventors: Xiaolong Ma, Beijing (CN); Huaxiang Yin, Beijing (CN); Sen Xu, Beijing (CN); Huilong Zhu, Poughkeepsie, NY (US)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 68 days.

(21) Appl. No.: 13/812,504

(22) PCT Filed: Oct. 12, 2012

(86) PCT No.: PCT/CN2012/001379
§ 371 (c)(1),
(2), (4) Date: Jan. 26, 2013

(87) PCT Pub. No.: WO2014/026308
PCT Pub. Date: Feb. 20, 2014

(30) Foreign Application Priority Data

Aug. 16, 2012 (CN) .......................... 2012 1 0293234

(51) Int. Cl.
*H01L 27/148* (2006.01)
*H01L 29/768* (2006.01)
*H01L 29/775* (2006.01)

(52) U.S. Cl.
CPC ................................. *H01L 29/775* (2013.01)
USPC ........................................ 257/240; 257/616

(58) Field of Classification Search
CPC .............. H01L 29/1054; H01L 29/161; H01L 21/0245; H01L 21/02532; H01L 21/02381; H01L 21/02452; H01L 21/02535
USPC .................................................... 257/616, 240
See application file for complete search history.

(56) References Cited

U.S. PATENT DOCUMENTS

| 7,416,605 B2 | 8/2008 | Zollner |
| 7,435,987 B1 | 10/2008 | Chui |
| 2014/0054547 A1* | 2/2014 | Eneman et al. ................. 257/24 |

FOREIGN PATENT DOCUMENTS

| CN | 1343374 A | 3/2002 |
| CN | 102640269 A | 8/2012 |
| JP | 200031469 A | 1/2000 |

* cited by examiner

*Primary Examiner* — Thien F Tran

(57) ABSTRACT

The present invention discloses a semiconductor device, which comprises a substrate, a buffer layer on the substrate, an inversely doped isolation layer on the buffer layer, a barrier layer on the inversely doped isolation layer, a channel layer on the barrier layer, a gate stack structure on the channel layer, and source and drain regions at both sides of the gate stack structure, characterized in that the buffer layer and/or the barrier layer and/or the inversely doped isolation layer are formed of SiGe alloys or SiGeSn alloys, and the channel layer is formed of a GeSn alloy. The semiconductor device according to the present invention uses a quantum well structure of SiGe/GeSn/SiGe to restrict transportation of carriers, and it introduces a stress through lattice mis-match to greatly increase the carrier mobility, thus improving the device driving capability so as to be adapted to high-speed and high-frequency application.

10 Claims, 1 Drawing Sheet

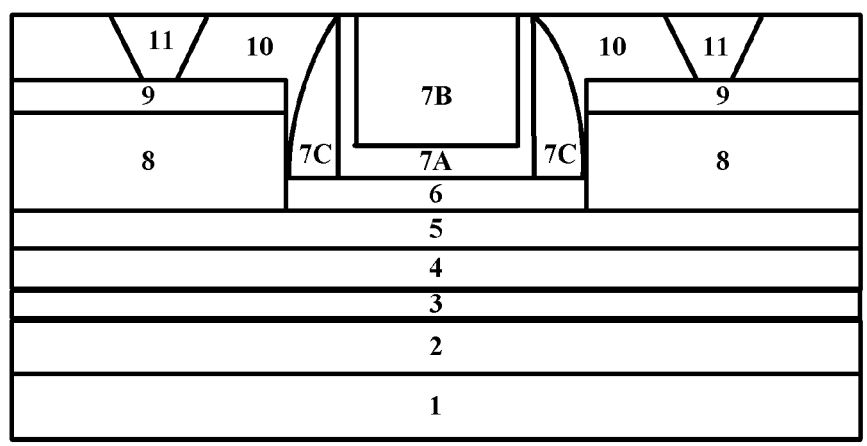

SEMICONDUCTOR DEVICE

CROSS REFERENCE

This application is a National Phase application of, and claims priority to, PCT Application No. PCT/CN2012/001379, filed on Oct. 12, 2012, entitled 'Semiconductor Device', which claimed priority to Chinese Application No. CN 201210293234.0, filed on Aug. 16, 2012. Both the PCT Application and Chinese Application are incorporated herein by reference in their entireties.

FIELD OF THE INVENTION

The present invention relates to the field of manufacturing of a semiconductor integrated circuit, in particular to a field effect transistor having a GeSn quantum well.

BACKGROUND OF THE INVENTION

With the continuous development of the integrated circuit technology, especially the continuous reduction of device size in scale, each of the key parameters, e.g. the threshold voltage of the device is reduced accordingly, and such advantages as reduced power consumption and increased integration promote the improvement of the overall performance of the device. But at the same time, the driving capability of the device is restricted by the conventional silicon material technology, wherein the carrier mobility is low, thus the driving capability of the device is comparatively insufficient to be used in high-speed and high-frequency application fields. Therefore, high mobility devices, especially high mobility transistors (HEMT) will be extensively used in the future.

A kind of existing high mobility field effect transistor (FET) is AlGaAs/GaAs-based, which comprises, for example, a GaAs substrate, an intrinsic GaAs layer formed on the GaAs substrate (used as a buffer layer and/or a lower cap layer), an intrinsic $Al_xGa_{1-x}As$ layer formed on the intrinsic GaAs layer (used as a potential well layer, an active layer and a control layer), an n-doped $Al_xGa_{1-x}As$ layer formed on the intrinsic $Al_xGa_{1-x}As$ layer (used as an upper cap layer), a gate stack formed on the upper cap layer and source and drain (contact) regions at both sides of the gate stack. During operation of the device, electrons that function as the carriers are generally limited in the potential well layer to form two-dimensional electron gas, so the carrier mobility in the layer is greatly increased, thereby improving the driving capability of the device.

However, the above-mentioned materials and technologies are not quite compatible with the existing Si-based CMOS technology, therefore a lot of extra processes and facilities are needed when manufacturing high mobility devices, which result in a high cost. As an alternative, another kind of existing high mobility field effect transistor is made by depositing SiGe alloys of different proportions on a Si substrate as a quantum layer and using Si or SiGe as a buffer layer, a barrier layer and a cap layer. Such SiGe/Si-based high mobility FET reduces the cost, but only a limited increase of the mobility is achieved due to the limitation of the material itself.

Thus there is the need for a FET which can be manufactured simply and be of higher carrier mobility.

SUMMARY OF THE INVENTION

In view of the above, an object of the present invention is to provide a field effect transistor having a GeSn quantum well so as to greatly increase the carrier mobility while simplifying the process and reducing the cost.

The above-mentioned object of the present invention is achieved by providing a semiconductor device, which comprises a substrate, a buffer layer on the substrate, an inversely doped isolation layer on the buffer layer, a barrier layer on the inversely doped isolation layer, a channel layer on the barrier layer, a gate stack structure on the channel layer, and source and drain regions at both sides of the gate stack structure, characterized in that the buffer layer and/or the barrier layer and/or the inversely doped isolation layer are formed of SiGe alloys or SiGeSn alloys, and the channel layer is formed of a GeSn alloy.

Wherein, the concentration of Ge in the buffer layer and/or the barrier layer and/or the inversely doped isolation layer is greater than 50%.

Wherein, the concentration of Sn in the buffer layer and/or the barrier layer and/or the inversely doped isolation layer is less than 25%.

Wherein, the thickness of the buffer layer is 100 nm-2 μm.

Wherein, the concentration of Sn in the channel layer is greater than 1% and less than 25%.

Wherein, the thickness of the channel layer is 5 nm-200 nm.

Wherein, a cap layer formed of SiGe alloy is disposed between the channel layer and the gate stack structure.

Wherein, the source and drain regions are formed of SiGeSn alloy.

Wherein, the source and drain regions have a first conductivity type, and the inversely doped isolation layer, the barrier layer and the channel region have a second conductivity type opposite to the first conductivity type.

Wherein, the forbidden-band width of the material of the barrier layer is greater than the band gap width of material of the channel layer.

The semiconductor device according to the present invention uses a quantum well structure of SiGe/GeSn/SiGe to restrict transportation of carriers, and it introduces a stress through lattice mis-match to greatly increase the carrier mobility, thus improving the device driving capability so as to be adapted to high-speed and high-frequency application.

BRIEF DESCRIPTION OF THE DRAWINGS

The technical solution of the present invention will be described below in details with reference to the drawing, wherein, FIG. 1 is a sectional view of the semiconductor device according to an embodiment of the present invention.

DETAILED DESCRIPTION OF THE PREFERRED EMBODIMENTS

The features and technical effects of the technical solution of the present invention will be described in details below with reference to the drawing and in conjunction with the exemplary embodiment. It shall be noted that similar reference signs are used to denote similar structures, and the terms "first", "second", "on", "under", "thick", "thin" and the like can be used to modify various device structures, but such modifications do not imply the spatial, sequential or hierarchical relations of the modified device structure unless otherwise specified.

FIG. 1 is a sectional view of the semiconductor device according to an embodiment of the present invention.

A substrate 1 is provided, which can be formed of (bulk) Si (e.g. monocrystalline Si wafer), SOI, and GeOI (Ge on Insulator). Preferably, the substrate 1 is formed of bulk Si or SOI so as to be compatible with the CMOS process.

A buffer layer 2 is formed on substrate 1 by a deposition method such as PECVD, MOCVD, MBE and ALD so as to reduce the lattice mis-match between the substrate 1 and the upper GeSn channel layer. The lattice constant of the material of the buffer layer 2 is between the Si/Ge of substrate 1 and the upper layer GeSn, which is preferably a SiGe alloy, and specifically it can be Si1-xGex, with the concentration (atomic number percentage) x of Ge being greater than 50%, i.e. x>0.5. The thickness of the buffer layer 2 is, for example, about 100 nm-2 μm. In addition, the buffer layer 2 can also be a SiGeSn ternary alloy, such as Si1-u-vGeuSnv, wherein the concentration u of Ge is greater than 50% and is preferably between 60%-70%, i.e. 0.6<u<0.7, and the concentration v of Sn is less than 25% and is preferably between 1%-10%, i.e. 0.01<v<0.1.

An inversely doped isolation layer 3 is formed on the buffer layer 2 by a deposition method such as PECVD, MOCVD, MBE and ALD, whose conductivity type is the same as that of the buffer layer 2 and/or the later formed barrier layer 4 but different from that of the later formed source and drain regions 8 (having a first conductivity type, e.g. n or p), for example, the inversely doped isolation layer 3 has a second conductivity type (p or n) for adjusting and controlling potential barrier and threshold voltage by doping. The material of the inversely doped isolation layer 3 can be a SiGe alloy, specifically Si1-yGey, wherein a concentration (atomic number percentage) y of Ge is between 55%-75%, i.e. 0.55<y<0.75. The thickness of the inversely doped isolation layer 3 is, for example, about 50 nm-500 nm. In-situ doping may be performed in the process of forming the inversely doped isolation layer 3, or an implantation doping may be performed after forming the inversely doped isolation layer 3, and the dopants include, for example, B, P, N, Al, Ga, etc. for adjusting the conductivity type.

Similarly, a barrier layer 4 is formed on the inversely doped isolation layer 3 by a deposition method such as PECVD, MOCVD, MBE and ALD, which is used for restricting the two-dimensional electron gas serving as carriers within the channel layer thereon. The material of the barrier layer 4 can be a SiGe alloy, specifically Si1-yGey, wherein the concentration (atomic number percentage) y of Ge is greater than 50% and preferably between 55%-75%, i.e. 0.55<y<0.75. The thickness of the barrier layer is, for example, about 50 nm-500 nm. In addition, the barrier layer 4 may also be the above-mentioned SiGeSn ternary alloy. The barrier layer 4 has a second conductivity type and a low doping concentration, i.e. it is of a p- or n-type. Particularly, the forbidden-band width E2 of the material of the barrier layer 4 is greater than the band gap width E1 of the material of the later formed channel layer 5.

A quantum well 5 is formed on the barrier layer 4 by deposition, so that it serves as the channel layer of the device. The material of the quantum well 5 is a GeSn alloy, specifically Ge1-zSnz, wherein the concentration (atomic number percentage) z of Sn is between 1%-25%, i.e. 0.01<z<0.25. The thickness of the quantum well is, for example, about 5 nm-200 nm. The GeSn-based quantum well layer can be formed by conventional methods like MBE, MOCVD and ALD, or it can be formed by depositing an amorphous Ge layer and a metal Sn layer sequentially and making them react to each other by performing a laser fast annealing.

Optionally, a cap layer 6 is formed on the quantum well layer 5 by deposition method such as PECVD, MOCVD, MBE and ALD, which is used for restricting the two-dimensional electron gas serving as the carriers within the channel layer 5 thereunder. The material of the cap layer 6 can be a SiGe alloy, specifically Si1-wGew, wherein the concentration (atom number percentage) w of Ge is greater than 50% and preferably between 60%-85%, i.e. 0.60<w<0.85. The thickness of the cap layer 6 is, for example, 100 nm-500 nm.

Afterwards, a gate stack structure 7 is formed on the channel layer 5, that is, the quantum well (and the cap layer 6). For example, a gate insulating layer 7A and a gate conductive layer 7B are formed by depositing sequentially by means of such conventional deposition methods like LPCVD, PECVD, HDPCVD, MOCVD, MBE, ALD, evaporation and sputtering, and by etching subsequently. When the gate stack structure employs a gate-first process, the gate insulation layer 7A is a high-K material, which includes but is not limited to nitrides (e.g. SiN, MN, TiN), metal oxides (mainly oxides of sub-group or lanthanide metal elements, e.g. $Al_2O_3$, $Ta_2O_5$, $TiO_2$, ZnO, $ZrO_2$, $HfO_2$, $CeO_2$, $Y_2O_3$, $La_2O_3$), perovskite phase oxides (e.g. $PbZr_xTi_{1-x}O_3$(PZT), $Ba_xSr_{1-x}TiO_3$ (BST)); the gate conductive layer 7B is a metal, a metal nitride or a combination thereof, wherein the metal includes Al, Ti, Cu, Mo, W and Ta to be used as the gate filling layer, and the metal nitride includes TiN, TaN to be used as the work function regulating layer. When the gate stack structure employs a gate-last process, it is used as a dummy gate stack structure, so the dummy gate insulation layer is silicon oxide, and the dummy gate conductive layer is polysilicon or amorphous silicon, then in the subsequent process, the dummy gate stack structure is removed by etching to form a gate trench, wherein a gate insulation layer 7A of a high-K material as mentioned above and the gate conductive layer 7B of a metal material as mentioned above are filled in sequence, thus the gate insulation layer 7A surrounds the bottom and sides of the gate conductive layer 7B. Gate spacers 7C formed of silicon nitride, silicon oxynitride and diamond like carbon (DLC) are formed at both sides of the gate insulation layer 7A/the gate conductive layer 7B by deposition and etching, and they together form a gate stack structure 6.

Source and drain regions 8 are formed at both sides of the gate stack structure 7.

When there is no cap layer 6 (not shown), the source and drain regions 8 are directly formed on the channel layer 5 by a deposition method such as MBE, MOCVD and ALD, which are formed of an SiGeSn alloy. Specifically, the source and drain regions 8 include Si1-u-vGeuSnv, wherein the concentration u of Ge is greater than 50% and preferably between 60%-70%, i.e. 0.6<u<0.7, and the concentration v of Sn is less than 25% and preferably between 1%-10%, i.e. 0.01<v<0.1. The thickness of the source and drain regions 8 can be about 500 nm-2 μm. Alternatively, source and drain regions 8 of a SiGeSn ternary alloy can also be formed by implanting Si in the channel layer 5 of GeSn at both sides of the gate stack structure 7 and performing annealing, in this case, the source and drain regions 8 will extend into the channel layer 5, unlike what is shown in FIG. 1, without contacting the lower barrier layer 4, namely, the depth of extension (not shown) is no more than the thickness of the channel layer 5. Preferably, raised source and drain regions 8 are formed by an epitaxial technique, such that the upper surfaces of the source and drain regions 8 are higher than the upper surface of the gate insulation layer 6A.

As shown in FIG. 1, when a cap layer 6 exists on the channel layer 5, a trench may be formed first by etching, and the etching may stop either at the interface between the channel layer 5 and the cap layer 6 or in the channel layer 5 without reaching the barrier layer 4. Then, source and drain regions 8 of a SiGeSn ternary alloy as mentioned above are formed by a deposition method such as MBE, MOCVD and ALD.

Preferably, when or after forming the source and drain regions 8, an in-situ doping or an implantation doping can be performed so that the source and drain regions 8 have a first conductivity type. The dopants may include B, P, Al, Ga, etc. for adjusting the conductivity type and concentration of the source and drain regions.

Finally, a source/drain contact layer 9, e.g. a metal silicide, may be formed on the source and drain regions 8 to reduce the source/drain resistance. An inter-layer dielectric (ILD) 10 is formed on the entire device, and the ILD 10 is etched to form source/drain contact holes which will be then filled by such metals as W, Al and Mo to form a source/drain contact plugs 11.

Therefore, according to the first embodiment of the present invention, the semiconductor device comprises a substrate 1, a buffer layer 2 on the substrate 1, a SiGe inversely doped isolation layer 3 on the buffer layer 2, a barrier layer 4 formed of a SiGe alloy on the inversely doped isolation layer 3, a channel layer 5 formed of a GeSn alloy on the barrier layer 4, a gate stack structure 7 on the channel layer 5, and source and drain regions at both sides of the gate stack structure 7. Wherein a cap layer formed of a SiGe alloy is disposed between the channel layer 5 and the gate stack structure 7. Wherein, the buffer layer 2, the inversely doped isolation layer 3, the barrier layer 4, and the cap layer 6 can be formed of a SiGe alloy or a SiGeSn ternary alloy that is the same as or similar to the source and drain regions 8, for example, the above-mentioned Si1-u-vGeuSnv. Parameters like the material proportions and thickness of the rest of the components have been described in the above manufacturing method, so they will not be elaborated any more.

The semiconductor device according to the present invention uses a quantum well structure of SiGe/GeSn/SiGe to restrict transportation of carriers, and it introduces a stress through lattice mis-match to greatly increase the carrier mobility, thus improving the device driving capability so as to be adapted to high-speed and high-frequency application.

While the invention has been described in conjunction with one or more exemplary embodiments, those skilled in the art are aware that various appropriate changes and equivalents can be made to the method for forming the device structure without departing from the scope of the present invention. In addition, on the basis of the disclosed teaching, many modifications may be adapted to specific situations or materials without departing from the scope of the present invention. Therefore, it is not intended to limit the present invention to the specific embodiments that are disclosed as the best ways of implementing the present invention, and the disclosed device structure and its manufacturing method shall include all embodiments that fall within the scope of the present invention.

What is claimed is:

1. A semiconductor device comprising a substrate, a buffer layer on the substrate, an inversely doped isolation layer on the buffer layer, a barrier layer on the inversely doped isolation layer, a channel layer on the barrier layer, a gate stack structure on the channel layer, and source and drain regions at both sides of the gate stack structure, characterized in that the buffer layer and/or the barrier layer and/or the inversely doped isolation layer are formed of SiGe alloys or SiGeSn alloys, and the channel layer is formed of a GeSn alloy.

2. The semiconductor device according to claim 1, wherein the concentration of Ge in the buffer layer and/or the barrier layer and/or the inversely doped isolation layer is greater than 50%.

3. The semiconductor device according to claim 1, wherein the concentration of Sn in the buffer layer and/or the barrier layer and/or the inversely doped isolation layer is less than 25%.

4. The semiconductor device according to claim 1, wherein the thickness of the buffer layer is 100 nm-2 µm.

5. The semiconductor device according to claim 1, wherein the concentration of Sn in the channel layer is greater than 1% and less than 25%.

6. The semiconductor device according to claim 1, wherein the thickness of the channel layer is 5 nm-200 nm.

7. The semiconductor device according to claim 1, wherein a cap layer formed of the SiGe alloy is disposed between the channel layer and the gate stack structure.

8. The semiconductor device according to claim 1, wherein the source and drain regions are formed of a SiGeSn alloy.

9. The semiconductor device according to claim 1, wherein the source and drain regions have a first conductivity type, and the inversely doped isolation layer, the barrier layer and the channel region have a second conductivity type opposite to the first conductivity type.

10. The semiconductor device according to claim 1, wherein the forbidden-band width of the material of the barrier layer is greater than the band gap width of the material of the channel layer.

* * * * *